United States Patent [19]
Frye et al.

[11] Patent Number: 5,898,223
[45] Date of Patent: Apr. 27, 1999

[54] CHIP-ON-CHIP IC PACKAGES

[75] Inventors: Robert Charles Frye, Piscataway; Yee Leng Low, Berkeley Heights; Kevin John O'Connor, Lebanon, all of N.J.

[73] Assignee: Lucent Technologies Inc., Murray Hill, N.J.

[21] Appl. No.: 08/946,980

[22] Filed: Oct. 8, 1997

[51] Int. Cl.⁶ .......................... H01L 23/48; H01L 23/52; H01L 29/40

[52] U.S. Cl. .......................... 257/777; 257/778; 257/738; 257/779

[58] Field of Search .................. 257/777, 685, 257/686, 778, 772, 737, 738, 779, 780; 438/108–110; 228/180.22

[56] References Cited

U.S. PATENT DOCUMENTS

| | | | |
|---|---|---|---|
| 4,764,804 | 8/1988 | Sahara et al. | 438/108 |
| 5,034,345 | 7/1991 | Shirahata | 438/108 |
| 5,480,834 | 1/1996 | Lake et al. | 438/108 |
| 5,534,465 | 7/1996 | Frye et al. | 438/108 |
| 5,585,282 | 12/1996 | Wood et al. | 257/785 |
| 5,726,500 | 3/1998 | Duboz et al. | 257/777 |

FOREIGN PATENT DOCUMENTS

| | | | |
|---|---|---|---|
| 58-82230 | 6/1983 | Japan | 257/777 |

*Primary Examiner*—Mahshid Saadat
*Assistant Examiner*—Jhihan B. Clark

[57] ABSTRACT

The specification describes interconnection layouts for chip-on-chip packages using solder bump interchip connections as vias between a single level metal interconnection pattern on the lower support IC chip and another single level interconnection pattern on the upper IC chip. This arrangement allows for the formation of air isolated crossovers of features on either chip.

15 Claims, 3 Drawing Sheets

CHIP-ON-CHIP IC PACKAGES

FIELD OF THE INVENTION

This invention relates to the manufacture of integrated circuit packages with chip-on-chip assemblies.

BACKGROUND OF THE INVENTION

For many years the trend in semiconductor device and package design was toward ever higher levels of integration, which in memory technology takes the form of integrating memory and logic on the same chip. Power modules and driver circuits are conventionally part of DRAM and SRAM devices, and many memory device designs have application specific logic embedded with the memory arrays on a common chip. However, while logic and memory semiconductor elements share many common features, there are differences. For example, a critical feature of a DRAM memory element is the storage capacitor. This element must be made optimally small, and essentially without defects or leakage. Logic devices have no comparable element, and are more forgiving in many device aspects. Consequently a wafer fabrication process that is tailored for memory device optimization is not usually optimum for logic devices. Thus, compromises are made in order to have different device species on the same semiconductor chip.

An alternative development to "integration or embedding" is the concept of "disintegration", where memory devices consist mainly of memory cells and their necessary support circuits are kept in one chip while the "application" logic and other transistors are put on another chip. These chips can be processed optimally for the size and nature of their components. In this technology, the "integration" is performed at the package level, and the key to its success is a packaging technology that produces a final product that is superior to a chip integrated system in performance and cost, and at least comparable in size.

A leading candidate for this packaging technology is flip chip bonding and assembly. Flip chip bonding is a well developed technology and is characterized by bonding bare silicon IC die upside down on an interconnect substrate such as a printed wiring board. Several bonding techniques have been developed, e.g. ball bonding, ball grid array (BGA—a form of ball bonding), and solder bump bonding. These techniques lead to relaxed I/O pitch through smaller contact surfaces, and area arrays rather than perimeter arrays for chip interconnection sites. Moreover, electrical performance is enhanced because lead lengths are reduced. Typically, the bonding method in these techniques is solder bonding.

Initial implementations of these developments were multi-chip modules in which two or more active device chips are bonded to a common interconnection substrate. The interconnection substrate is a standard printed wiring board, or in more sophisticated packaging designs, a silicon wafer. Most of the circuitry that provides intra chip interconnections, i.e. connections between chips, is formed on the interconnection substrate. The chips themselves contain inter chip interconnections in the form of circuits (metallization) within the chips.

The metallization terminates in arrays of I/O bonding sites which are the interconnection sites for intra chip interconnections. With state of the art logic and memory chips having dozens or hundreds of I/O sites to interconnect, the intra chip interconnections on the interconnection substrate become very complex. In current designs, this circuitry requires many crossover interconnects. To provide crossovers in the intra chip interconnections, a second level of printed circuits is typically provided. Multi-level printed circuit boards, and multi-level silicon interconnection substrates are well known and widely used, but are still more expensive, and provide less versatility, than single level interconnection arrangements.

A more recent advance in multi-chip module technology is the chip-on-chip approach where an active chip is flip-chip bonded to another active chip rather than to an interconnection substrate. When the relative sizes of the chips allows, two or more small chips can be bonded to a larger chip. Logic chips, e.g. digital signal processors, are quite large with a footprint sufficient to contain at least two standard memory chips. The logic chip, i.e. the support chip, is packaged in a lead frame package thus eliminating the board or interconnection substrate of more conventional MCM packages. The intra chip interconnection circuitry in the chip-on-chip package is typically constructed on the surface of the support chip. However, the same limitations arise as discussed above, i.e. crossover connections are frequently required, and the support chip must then be provided with two levels of interconnections.

Multi-level interconnection assemblies are well known and widely used, but are still more expensive, and provide less versatility, than single level interconnection arrangements.

STATEMENT OF THE INVENTION

We have developed a chip-on-chip assembly in which all intra chip interconnections are made in a single level of interconnection on each chip. This is accomplished according to the invention by shifting at least some of the intra chip interconnection circuitry to the smaller (top) chips. If there are two or more top chips, the intra chip circuitry can be designed as if the interconnection circuitry on the two chips comprise a common interconnection level, i.e. interconnections to one of the upper chips can include runners on the other upper chip. A key feature of this arrangement is the utilization of the gap already present in chip-on-chip bonding to provide air isolated crossover connections.

DETAILED DESCRIPTION

Figure 1:
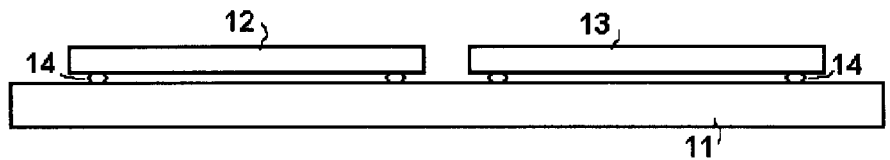
FIG. 1 is schematic representation of a conventional chip-on-chip interconnection arrangement.

Referring to FIG. 1, a conventional chip-on-chip arrangement is shown with chip 11 serving as the substrate chip supporting chips 12 and 13. As is evident, in a typical arrangement, the substrate chip 11 is larger than chips 12 and 13. Characteristically, the larger chips are microprocessor chips or Application Specific ICs (ASICs) and the smaller chips are memory chips. In the arrangement shown it is also evident that the overall package size in the chip-on-chip arrangement has a substantially smaller footprint than would a large microprocessor chip with all memory on chip.

Solder bump interchip interconnections, i.e. between chips 12 and 13 and the substrate chip 11, are indicated at 14 in FIG. 1. For simplicity, only four solder bump interconnections are shown which represent, in an actual case, a larger array, typically an edge array, of such bumps.

Figure 2:
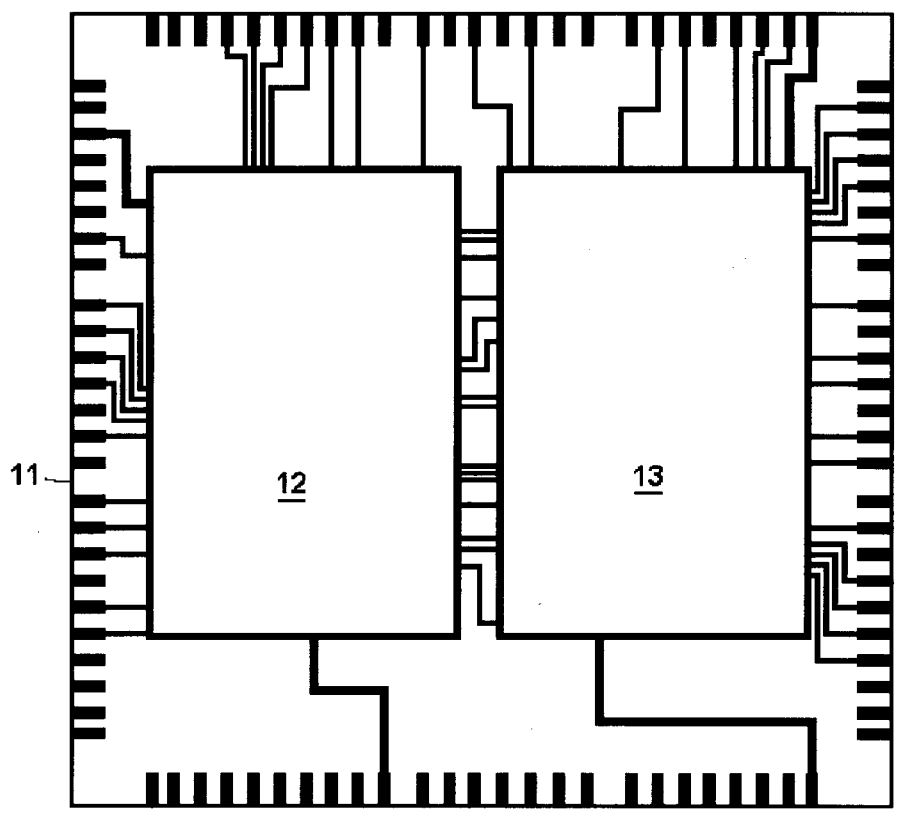
FIG. 2 is a plan view of a conventional chip-on-chip interconnection arrangement.
Figure 3:
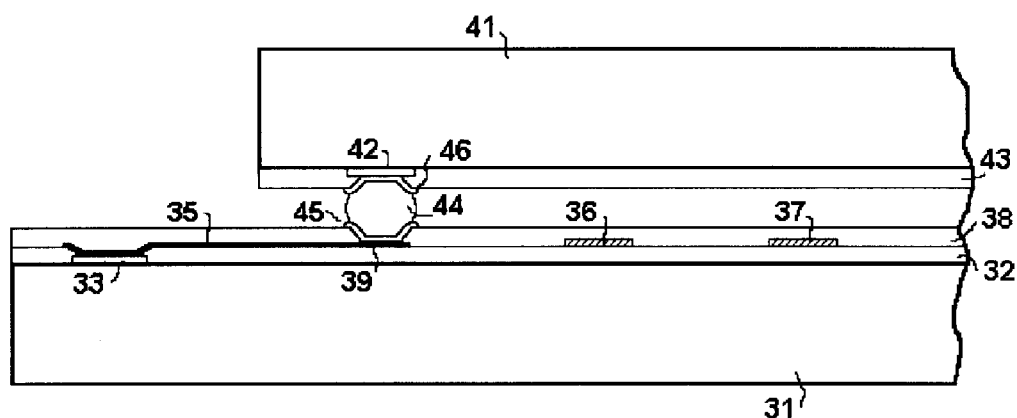
FIG. 3 is a schematic view of a portion of the interconnections in a conventional chip-on-chip assembly.

It has been recognized in the art that chip-on-chip arrangements offer the advantage of utilizing the surface area of the support chip for interconnection routing. The ability to route interconnections over the substrate surface to reach alternative inter chip bonding sites adds considerable flexibility of the interconnection circuit designer. Accordingly, as shown in FIG. 2, conventional chip-on-chip assemblies, with chips 12 and 13 supported by chip II, have interconnection circuits on the support chip 11. A portion of the interconnection arrangement can be seen in more detail in FIG. 3. In FIG. 3, substrate 31 is the support chip shown covered with a thick insulating layer 32, typically polyimide. Insulating layer 32 may be the capping layer of the IC but is typically applied over the capping layer, e.g. SINCAPS (not shown). Layer 32 is preferably a photodefinable polymer to facilitate window formation over the IC bonding pads one of which is shown at 33. The desired interconnection metallization is formed on layer 32 and is represented by runners 35, 36 and 37. Runner 35 contacts bonding pad 33 and extends laterally along the surface of layer 32 as shown, and runners 36 and 37 extend in the y-direction toward the viewer. After the metal layer is deposited and patterned it is covered with insulating layer 38, with a window formed in layer 38 over portion 39 of runner 35. The upper chip 41 is shown with IC bonding pad 42, and insulating layer 43 with a window formed for the bonding pad. The inter chip interconnection is made with solder bump 44, shown here with under bump metallization at 45 on the support chip and at 46 on the upper chip.

An important advantage of chip-on-chip arrangements in which the support chip is substantially larger than the chips being carried by the support chip is that the metallization level on the support chip can effectively utilize the area on the support chip that extends beyond the perimeter of the upper chips. In a direct interconnection configuration, i.e. where the chips are interconnected is bonding pad to bonding pad, the bonding pads on the support substrate would be located in-board of the edges of the support chip, where they can mate directly with edge arrays of pads on the upper chips. The advantage of the former arrangement is evident in FIG. 2 where substantial routing is effected outside of the upper chip footprints, and where a large area is also available for I/O bonding pad sites for the support substrate.

Figure 4:
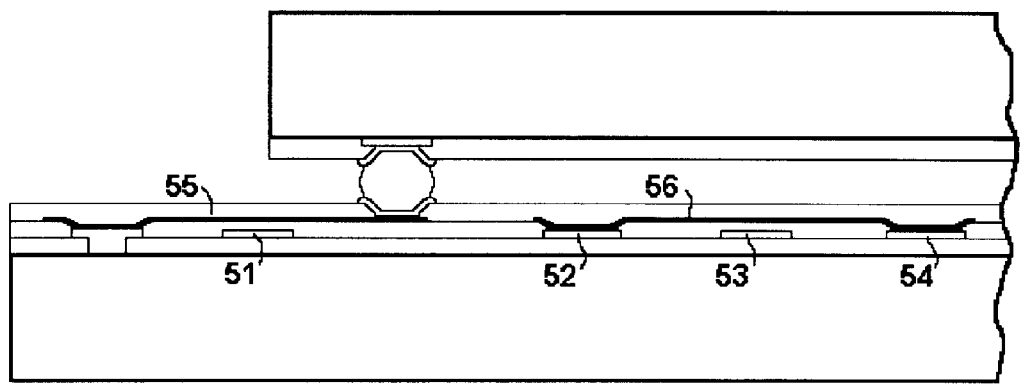
FIG. 4 is a schematic view of a conventional two level interconnection arrangement implemented in a chip-on-chip assembly.

In the development of chip-on-chip assemblies the need for crossover interconnections has been recognized and crossover arrangements have been implemented in two level metal structures like that shown in FIG. 4. Here metal runners 51, 52, 53 and 54 comprise the first level metal, and runners 55 and 56 the second level metal. As is evident two levels of metal provide crossover capability, e.g. runners 55 and 56 crossing runners 51 and 53 respectively.

Figure 5:
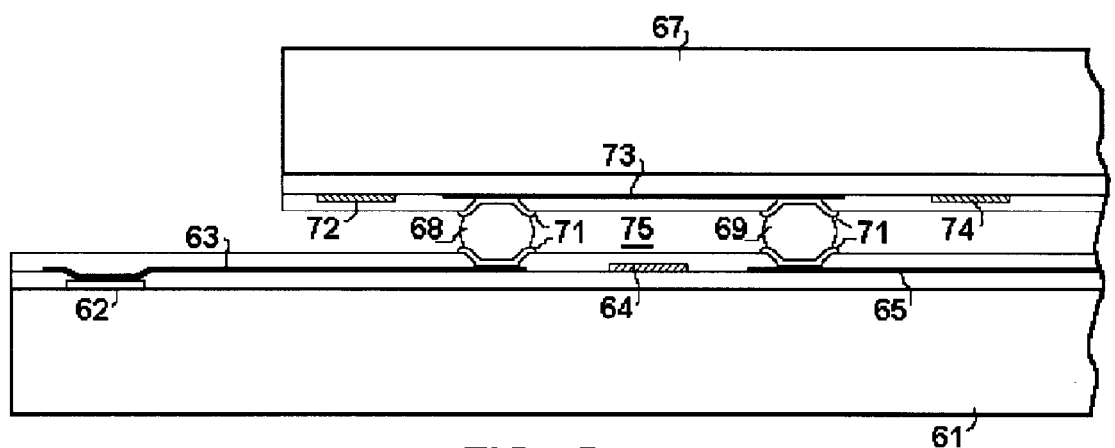
FIG. 5 is a schematic diagram, for comparison with FIGS. 3 and 4, showing the single level interconnection circuits of the invention.

Although the two level metal approach is useful, an improved design according to the invention is shown in FIG. 5. In the interconnect arrangement of FIG. 5, one level of metal is formed on the support chip and another level is formed on the upper chip. In FIG. 5, support chip substrate 61 is shown with contact pad 62, and single level interconnection circuitry is represented by runners 63, 64 and 65. An upper chip 67 is shown flip-chip bonded to support chip 61 by solder bumps 68 and 69. Under bump metallization 71 is provided between the solder bumps and the chip surfaces. A single level of metal interconnection is formed on upper chip 67 and is represented by runners 72, 73 and 74. In the interconnect arrangement shown, runner 73 on the upper chip surface crosses runner 64 on the support chip surface via the solder bump interconnections 68 and 69. The crossover is air isolated by gap 75. The air isolation crossovers in the interconnection assemblies according to the invention allow essentially complete flexibility in routing design. The term "air isolation" is used as a term of art to mean a passive gap which may or may not be filled with a filler material such as epoxy for managing thermal expansion effects.

The under bump metallization 71 in FIG. 5 may be one of a variety of known metals. These metals must adhere well to the material of the runners or the contact pads, must be wettable by typical tin solder formulations, and be highly conductive. A structure meeting these requirements is a composite of chromium and copper. Chromium is deposited first, to adhere to the contact pad, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Or it can be sputtered using separate chromium and copper targets, and transitioning between the two. The latter option produces a layer with a graded composition, and is a preferred technique.

In the preferred embodiment of the invention, the under bump metallization comprises a first layer of chromium with a thickness of the order of 500–5000 Angstroms and preferably 1000–3000 Angstroms. Chromium adheres well to aluminum runners, and to Ti—Pd—Au contact pad surfaces, and also adheres to the dielectric layers present in the structure. It also is refractory and forms a corrosion resistant interface with the aluminum contact. A second layer Cr/Cu layer is a transition layer to provide a solder wettable and a metallurgically sound interface between the chromium layer and a subsequently formed copper layer. The transition layer is preferably formed by sputtering in an apparatus with both chromium and copper targets, and transitioning between the targets. This results in a co-sputtered layer with a composition varying between pure chromium and pure copper. The thickness of the transition layer is of the order of 1000–5000 Angstroms, and preferably 2000–3000 Angstroms.

Next a copper layer with a thickness of the order of 1000–10000 Angstroms, and preferably 2000–6000 Angstroms is deposited on the transition layer. The copper layer 46 is wettable with solder materials commonly used for the solder bumps. The melting point of most copper eutectics with tin solders is relatively low, and at the soldering temperature the surface of the copper layer dissolves in the solder bump forming a physically and electrically sound bond. Even if all the copper dissolves into the solder layer the solder will still adhere and wet the Cr/Cu layer. An optional layer of gold that may be applied to the surface of the copper layer to inhibit oxidation of the copper surface. The optional gold layer has a thickness of 500–3000 Angstroms, and preferably 1000–2000 Angstroms.

Additional details for processing this multilevel under bump metallization system can be found in my co-pending patent application Ser. No. 08/825,923, field Apr. 2, 1997 which is incorporated herein by reference. While this metallization system is particularly effective for the interconnection process described, other alternatives known in the art may also be used.

Figure 6:
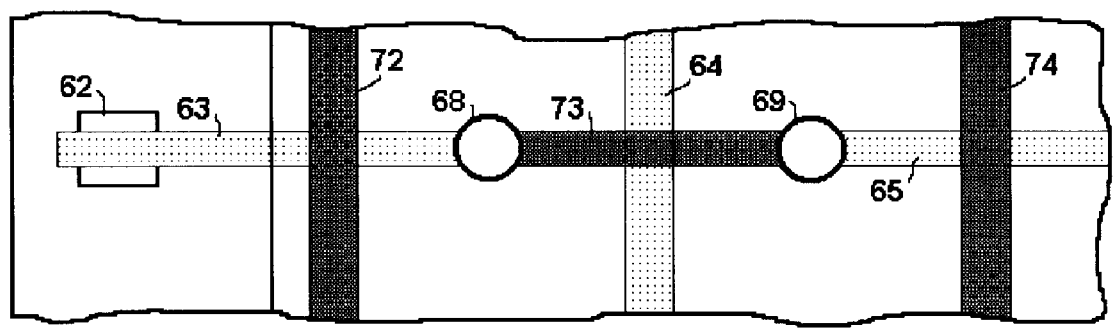
FIG. 6 is plan view of the portion of the single level interconnection arrangement shown in FIG. 5.

The interconnection assembly of FIG. 5 is shown in plan view in FIG. 6 where the metallization on the support chip is shown with light shading and the metallization on the portion of the upper chip is shown with darker shading. The crossovers, runner 73 over runner 64, and runner 65 under runner 74, are more evident in this view. In the schematic diagrams shown in this description the runners are routed in x- and y-direction. However, as will be appreciated by those skilled in the art, they can cross at other than right angles, e.g. they can be routed along 45° angles.

Figure 7:
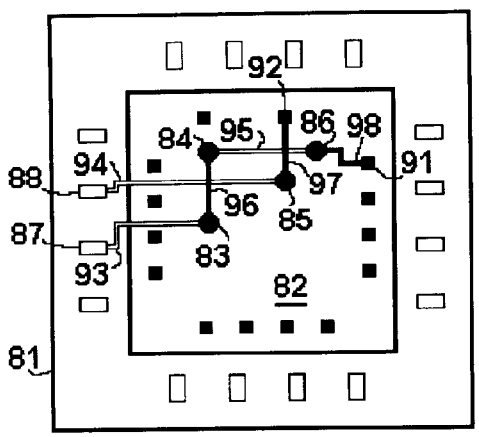
FIG. 7 is a schematic diagram illustrating multiple crossovers implemented in single level interconnection circuits according to the invention.

A combination of crossover interconnections, using solder bump via interconnections, can be seen in the schematic diagram of FIG. 7. The support chip is shown at 81 and the upper "flip-chip bonded" chip at 82. The chips are bonded with solder ball bonds 83, 84, 85 and 86. The objective is to interconnect contact pads 87 and 88, on support chip 81, with contact pads 91 and 92 on upper chip 82 as shown. Metal runners 93, 94 and 95 are located on the substrate chip 81 and runners 96, 97 and 98 are located on upper chip 82. The runners interconnect the bonding pads via solder ball interconnections as shown, and runner 96 crosses runner 94 and runner 97 crosses runner 95.

In the interconnection arrangement of the invention at least some of the solder ball bonds are so-called vias, i.e. interconnections between metal levels as contrasted with typical prior art solder ball bonds that interconnect contact pads on the chip substrate. The placement of these via solder ball interconnections can be arbitrary, i.e. at any site in the footprint of the upper chips. The use of solder ball bonds as via interconnections typically means that the number of solder ball bonds is greater than in a conventional chip-on-chip assembly. The increased number of solder ball bonds however adds to the mechanical integrity of the assembly, and also provides better thermal distribution, and more heat sinking options.

Figure 8:
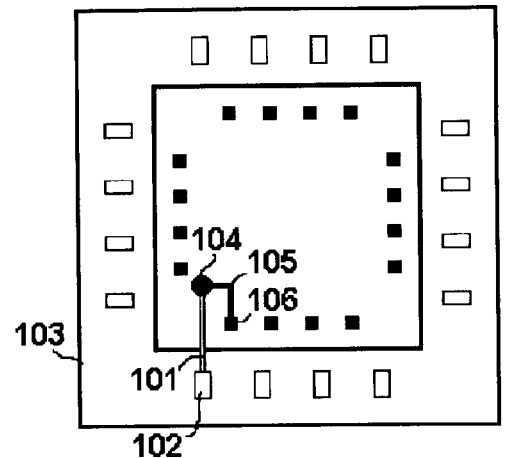
FIG. 8 is a schematic diagram of "wrong way" interconnections that form part of a typical layout according to the invention.

Because many of the solder bump interconnection sites are located "in-board" of the chip edge, and the terminations typically are at or near the chip edge, some of the interconnections may be "wrong way" interconnections. An example is shown in FIG. 8. Runner 101 interconnects edge pad 102 on support chip 103 with the via solder bump interconnection 104. Runner 105 on the upper chip 100 interconnects the solder bump 104 and contact pad 106. Since the path is not direct, some automatic routing programs will discourage these routes and assign excessive penalties to them. However, due to the efficient crossover layout resulting from using solder bump vias the overall interconnection layout, even with a substantial number of wrong way routes, can be very efficient.

Figure 9:
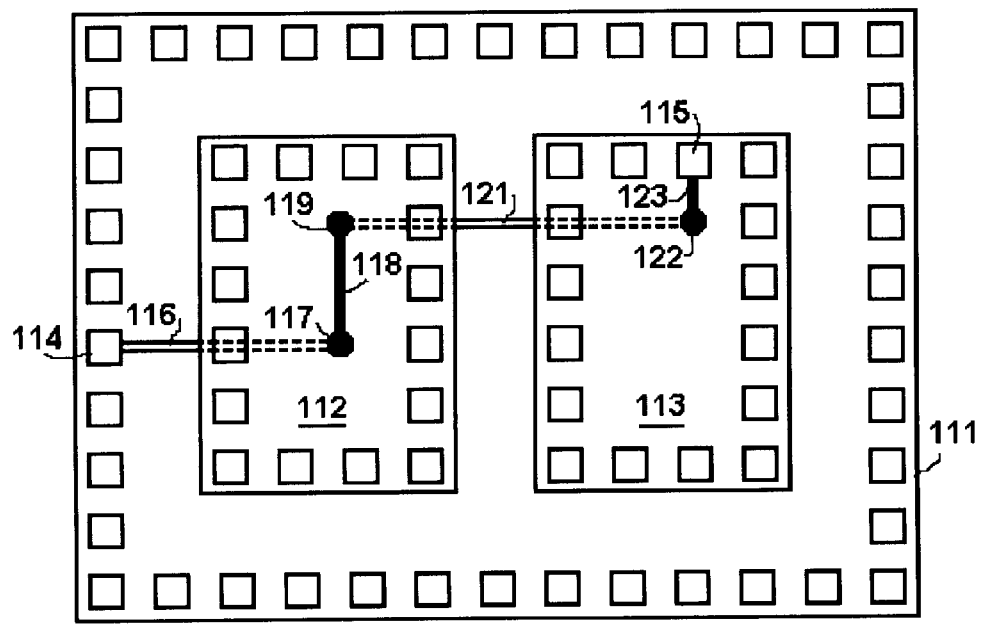
FIG. 9 is a schematic view of a two on one chip-on-chip package showing interconnection paths across one of the upper chips to connect the other upper chip to a site on the "wrong" side of the support chip.

Another feature of the invention is that runners interconnecting a support chip site and a site on one tipper chip can be routed across another upper chip giving added flexibility to the interconnection layout. This alternative is illustrated in FIG. 9 where support chip 111 supports two upper chips 112 and 113. To connect the contact pad 114 on support chip 111 with contact pad 115, a routing like the one shown in FIG. 9 is available using via bumps according to the invention. The routing is from pad 114, along support chip runner 116 to via bump 117, to the upper chip metallization and runner 118 on the upper chip, to via bump 119, back to the support chip metallization and runner 121, then to the via bump 122, then to the upper chip metallization runner 123, and finally to 15 tipper chip pad 115. Two crossovers, runner 118 and runner 123, and one "crossunder", runner 121, are included in this route.

The interconnection techniques described above have been implemented and tested to investigate the degree of capacitive interaction between the interconnection metallization levels and the IC chips. It might be predicted that capacitive coupling between the interconnection circuits located in such proximity to active devices in the configurations described above would interfere excessively with the functioning of the underlying devices. It was established that device performance is not impaired.

The solder bumps used for via interconnections can be applied by conventional techniques such as evaporation or screen printing. In the configurations useful for this invention, the entire chip area is potentially available for solder bump interconnections. Therefore layouts can be created with larger than normal spacing between solder bump interconnects. Small pitch chips can be interconnected with relatively large solder bumps. Accordingly, solder paste techniques, typically restricted to use with relatively large pitch pad arrays, can be used to interconnect fine pitch pad arrays by routing the terminations to solder bump sites in the interior portions of the chip footprint, as shown for example in FIG. 8.

In this description and in the appended claims the term "active" used in connection with integrated circuit chips means semiconductor chips that contain a plurality of transistor and/or diode devices. In chip-on-chip interconnection structures, as that term is known in the art, both the support chip and the chips being supported are active chips. This contrasts with arrangements wherein the interconnection substrate (which may be silicon) is purely a support structure for other active chips, or for passive devices such as inductors or capacitors.

Also the term solder "bumps" as used in the description and the appended claims is meant to include solder formations of substantial size that are employed both to bond planar structures together and to interconnect these structures electrically. Such solder bumps also typically bond these structures in an offsetting relationship leaving a void or space between the upper planar surface on the lower element and the lower planar surface of the upper element. Solder formations of this kind can be pillar-shaped, or ball shaped. It is a feature of this invention that these solder bumps are used both for interconnecting sites between the upper and lower chips (interchip connections) and for interconnecting two or more sites located on the upper chip and/or two or more sites located on the lower chip (intrachip connections).

The term "runner" as used herein means a portion of the interconnection circuit that extends between interconnection points, either on the upper surface of the support chip surface or the lower (facing) surface of the upper chip.

The term "crossover" in electrical interconnection technology is well understood and in the context of this invention is meant to convey a situation wherein a circuit runner of the interconnection circuit on one chip extends in a first direction, and at least one runner of the interconnection circuit on the facing chip extends in a second direction, and said first and second directions intersect when viewed from a vantage point normal to the planes of the chips. The crossover interconnection can be made to cross runners on either the lower chip or one or more upper chips. In the latter case the interconnection may be considered a "crossunder" but is intended to be encompassed by the term crossover in the general sense.

Use of the principles of this invention, i.e. using both of the facing planar surfaces in a chip-on-chip configuration for interconnection circuitry, expands substantially the area available for interconnection circuitry. While the use of the facing planar surfaces provides the opportunity for using the already existing air gap between the chips for air isolated crossovers, and also yields relatively short interconnection path lengths, it is possible to further expand the interconnection area by using the top planar surface of the upper chips. For example, passive devices such as inductors or capacitors can be placed on the to top surface of the chip-on-chip assembly. Further capacity for circuitry can be made available using multi-level metal patterns on either the support chip or the upper chip, or both.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Integrated circuit package comprising:
   a. a first integrated circuit chip containing a plurality of active semiconductor devices, said first integrated circuit chip having a length $L_1$, a width $W_1$, an upper planar surface with area $A_1$ equal to $L_1 \times W_1$, and a lower planar surface with area $A_1$,
   b. a first interconnection circuit on said upper planar surface of said first integrated circuit chip,
   c. a second integrated chip supported by said first chip, said second integrated circuit chip containing a plurality of active semiconductor devices and having a length $L_2$, a width $W_2$, an upper planar surface with area $A_2$ equal to $L_2 \times W_2$, and a lower planar surface with area $A_2$, and where $A_2 < A_1$,
   d. a plurality of bonding means for bonding said lower planar surface of said second integrated circuit chip to said upper planar surface of said first integrated circuit chip, leaving a space between said lower planar surface of said second integrated circuit chip and said upper planar surface of said first integrated circuit chip, and
   e. a second interconnection circuit on the lower planar surface of said second integrated circuit chip, and
   f. a plurality of runners in each of said first and second interconnection circuits and in which at least some of the runners in said first interconnection circuit electrically connect two of said plurality of bonding means and at least some of the runners in said second interconnection circuit electrically connect two of said plurality of bonding means.

2. The integrated circuit package of claim 1 wherein said plurality of bonding means comprises solder bumps.

3. The integrated circuit package of claim 1 wherein a first runner in said first interconnection circuit electrically connects with a first solder bump, said first solder bump electrically connects to a first runner in said second interconnection circuit, said first runner in said second interconnection circuit electrically connects to a second solder bump, and said second solder bump electrically connects to a second runner in said first interconnection circuit.

4. The integrated circuit package of claim 1 wherein a first runner in said second interconnection circuit electrically connects with a first solder bump, said first solder bump electrically connects to a first runner in said first interconnection circuit, said first runner in said first interconnection circuit electrically connects to a second solder bump, and said second solder bump electrically connects to a second runner in said second interconnection circuit.

5. The integrated circuit package of claim 1 in which the said first integrated circuit chip supports at least two integrated circuit chips.

6. The integrated circuit package of claim 2 additionally including under bump metallization between said solder bumps and said first and second interconnection circuits.

7. The integrated circuit of claim 3 further including a third runner in said first interconnection circuit extending along a first direction along said upper planar surface of said first integrated circuit chip and wherein said first runner in said second interconnection circuit extends in a second direction along said lower planar surface of said second integrated circuit chip and further wherein said first direction and said second direction intersect when viewed from a direction normal to said planar surfaces.

8. The integrated circuit of claim 4 further including a third runner in said second interconnection circuit extending along a first direction along said lower planar surface of said second integrated circuit chip and wherein said first runner in said first interconnection circuit extends in a second direction along said upper planar surface of said first integrated circuit chip and further wherein said first direction and said second direction intersect when viewed from a direction normal to said planar surfaces.

9. The integrated circuit package of claim 6 in which the under bump metallization comprises a layer of chromium and a layer of copper.

10. The integrated circuit of claim 9 in which the said first and second interconnection circuits comprise aluminum.

11. Integrated circuit package comprising:
   a. a first integrated circuit chip, said first integrated circuit chip containing a plurality of active semiconductor devices and having a length $L_1$, a width $W_1$, an upper planar surface with area $A_1$ equal to $L_1 \times W_1$, and a lower planar surface with area $A_1$,
   b. a first interconnection circuit on said upper planar surface of said first integrated circuit chip,
   c. a second integrated chip supported by said first chip, said second integrated circuit chip containing a plurality of active semiconductor devices and having a length $L_2$, a width $W_2$, an upper planar surface with area $A_2$ equal to $L_2 \times W_2$, and a lower planar surface with area $A_2$, and where $A_2 < A_1$,
   d. a third integrated chip supported by said first chip, said third integrated circuit chip containing a plurality of active semiconductor devices having a length $L_3$, a width $W_3$, an upper planar surface with area $A_3$ equal to $L_3 \times W_3$, and a lower planar surface with area $A_3$, and where $A_3 < A_1$, and further where $A_2 + A_3 < A_1$, $L_2 + L_3 < L_1$, and $W_2$ and $W_3 < W_1$,
   e. a plurality of bonding means for bonding said lower planar surfaces of said second and third integrated circuit chips to said upper planar surface of said first integrated circuit chip, leaving space between said lower planar surfaces of said second and third integrated circuit chips and said upper planar surface of said first integrated circuit chip, f. a second interconnection circuit on the lower planar surface of said second integrated circuit chip, and g. a third interconnection circuit on the lower planar surface of said third integrated circuit chip, and h. a plurality of runners in each of said first, second, and third interconnection circuits and in which at least some of the runners in said first, second and third interconnection circuit electrically connect two of said plurality of bonding means.

12. The integrated circuit package of claim 11 wherein said plurality of bonding means comprises solder bumps.

13. The integrated circuit package of claim 11 wherein a first runner in said first interconnection circuit electrically connects with a first solder bump, said first solder bump electrically connects to a first runner in said second interconnection circuit, said first runner in said second interconnection circuit electrically connects to a second solder bump, said second solder bump electrically connects to a second runner in said first interconnection circuit, said second runner in said first interconnection circuit electrically connects to a third solder bump, and said third solder bump electrically connects to a first runner in said third interconnection circuit.

14. The integrated circuit package of claim 11 wherein a first runner in said second interconnection circuit electrically connects with a first solder bump, said first solder bump electrically connects to a first runner in said first interconnection circuit, said first runner in said first interconnection circuit electrically connects to a second solder buimp, and said second solder bump electrically connects to a first runner in said third interconnection circuit.

15. The integrated circuit of claim 13 further including a third runner in said first interconnection circuit extending along a first direction along said upper planar surface of said first integrated circuit chip and wherein said first runner in said second interconnection circuit extends in a second direction along said lower planar surface of said second integrated circuit chip and further wherein said first direction and said second direction intersect when viewed from a direction normal to said planar surfaces.

* * * * *